United States Patent
Fan et al.

(10) Patent No.: US 8,541,870 B1
(45) Date of Patent: Sep. 24, 2013

(54) SEMICONDUCTOR PACKAGE UTILIZING TAPE TO REINFORCE FIXING OF LEADS TO DIE PAD

(71) Applicant: Powertech Technology Inc., Hsinchu (TW)

(72) Inventors: Wen-Jeng Fan, Hsinchu (TW); Che-Min Chu, Hsinchu (TW); Wei-Min Chen, Hsinchu (TW)

(73) Assignee: PowerTech Technology Inc., Hsinchu (TW)

( * ) Notice: Subject to any disclaimer, the term of this patent is extended or adjusted under 35 U.S.C. 154(b) by 0 days.

(21) Appl. No.: 13/645,289

(22) Filed: Oct. 4, 2012

(51) Int. Cl.
*H01L 23/495* (2006.01)

(52) U.S. Cl.
USPC ..... 257/666; 257/676; 257/686; 257/E23.039

(58) Field of Classification Search
USPC ................... 257/666–670, 676, 686
See application file for complete search history.

(56) References Cited

U.S. PATENT DOCUMENTS

| | | | |
|---|---|---|---|
| 7,339,257 B2 * | 3/2008 | Ozawa et al. | 257/666 |
| 2010/0122454 A1 | 5/2010 | Fan et al. | |
| 2010/0127362 A1 | 5/2010 | Fan et al. | |

* cited by examiner

*Primary Examiner* — Dung A. Le
(74) *Attorney, Agent, or Firm* — Muncy, Geissler, Olds & Lowe, PLLC

(57) ABSTRACT

Disclosed is a semiconductor package utilizing a tape to reinforce fixing of leads to a die pad having a through hole. The package primarily comprises a leadframe having the plurality of leads and the die pad, a tape, at least a chip, and an encapsulant. The die pad. The tape is attached beneath the leadframe adjacent to the inner fingers of the leads to fix the leads and the die pad for wire-bonding. Additionally, the tape does not completely cover the through hole. The chip is disposed on the leads and the die pad and electrically connected to the inner fingers. The encapsulant encapsulates the die pad, the tape and the chip with the leads being insulatedly bonded where the encapsulant further completely fills into the through hole through its opening without completely covered by the tape.

10 Claims, 5 Drawing Sheets

US 8,541,870 B1

SEMICONDUCTOR PACKAGE UTILIZING TAPE TO REINFORCE FIXING OF LEADS TO DIE PAD

FIELD OF THE INVENTION

The present invention relates to a packaged semiconductor device and more specifically to a semiconductor package utilizing a tape to reinforce fixing of leads to a die pad.

BACKGROUND OF THE INVENTION

Semiconductor packages are designed to seal and protect chip(s) encapsulated inside where the chip carrier has been gradually changed from leadframes to wiring substrates. However, leadframes still serve their purposes for low-pin count products and for severe environmental requirements such as TSOP 48 for NAND flash. As the chip dimension and the number of stacked chips increases related to the package dimension, more defeats are shown up during molding processes such as entrapment of bubbles during molding processes and fixing of leads during wire bonding processes.

Furthermore, conventional leadframe-type semiconductor packages are applied by the original applicant which are disclosed in US Patent Publication Number 2010/0122454 A1 entitled "METHOD FOR FORMING AN ISOLATED INNER LEAD FROM A LEADFRAME" and in US Patent Publication Number 2010/0127362 A1 entitled "SEMICONDUCTOR PACKAGE HAVING ISOLATED INNER LEAD" where chips are attached on the leads of a leadframe, however, the pad side of the chip is lack of the wire-bonding support from the die pad of the leadframe.

SUMMARY OF THE INVENTION

The main purpose of the present invention is to provide a semiconductor package utilizing tape to reinforce fixing of leads to a die pad to provide supports to the leads during wire-bonding processes and to enhance molding filling capability of a die pad having a through hole.

According to the present invention, a semiconductor package utilizing a tape to reinforce fixing of leads to a die pad is revealed, primarily comprising a leadframe, the tape, a first chip, and an encapsulant. The leadframe has the plurality of leads and the die pad where each lead has a first inner lead and the die pad has a through hole. The tape is attached beneath the leadframe adjacent to the first inner fingers to fix the die pad and at least one of the leads in a manner that the through hole covered by the tape has a first opening not completely covered by the tape. The first chip is disposed on the leads and the die pad and the first chip has a plurality of first bonding pads which are electrically connected to the first inner fingers. The encapsulant encapsulates the die pad, the tape and the chip with the leads being insulatedly bonded where the encapsulant further completely fills into the through hole through the first opening. More specifically, the first chip can completely cover a second opening of the through hole. At least a second chip can be stacked on the first chip, the second chip has a plurality of second bonding pads electrically connected to the first inner leads, wherein the first bonding pads and the second bonding pads are located and aligned within the adhesion area of the tape.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers; actual shapes, or actual dimension ratios can be selectively designed and disposed and the detail component layouts may be more complicated.

Figure 1:
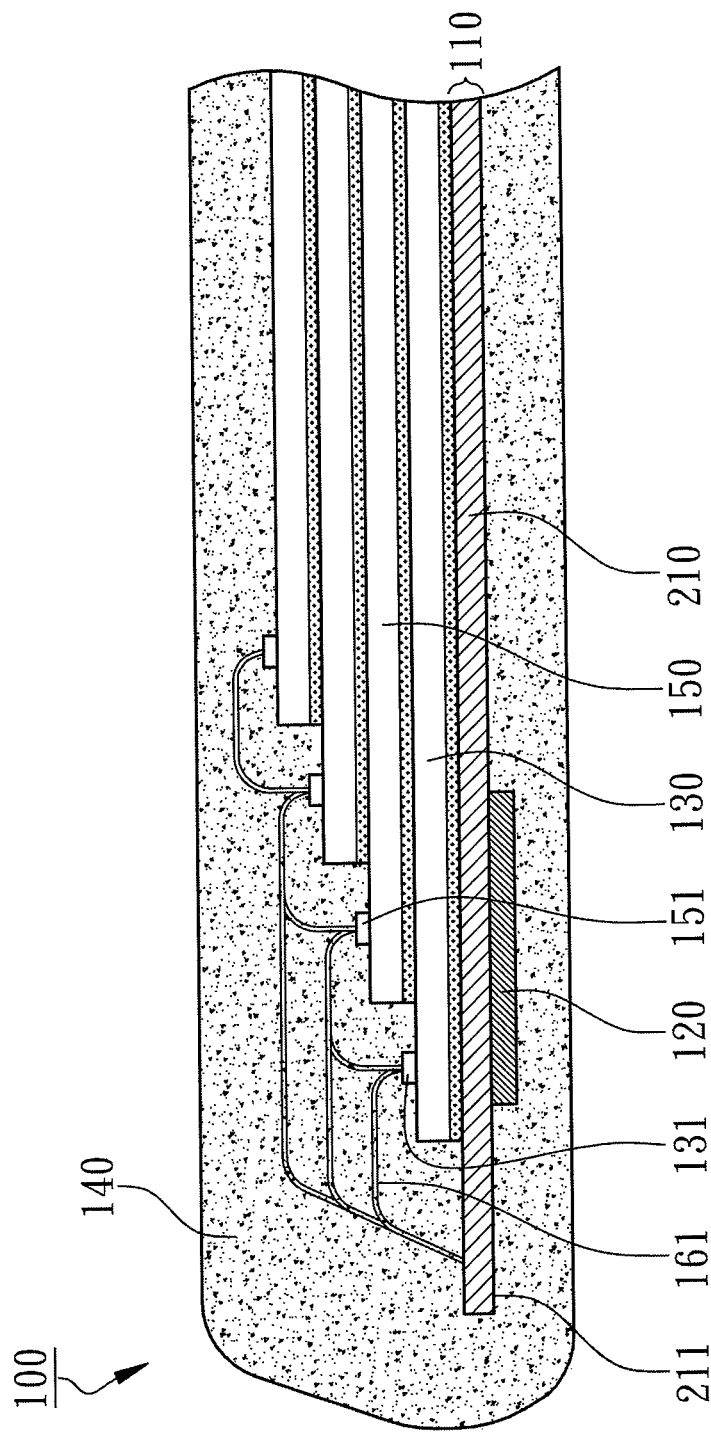
FIG. 1 is a partially component cross-sectional view illustrating a semiconductor package utilizing a tape to reinforce fixing of leads to a die pad according to the preferred embodiment of the present invention.
Figure 2:
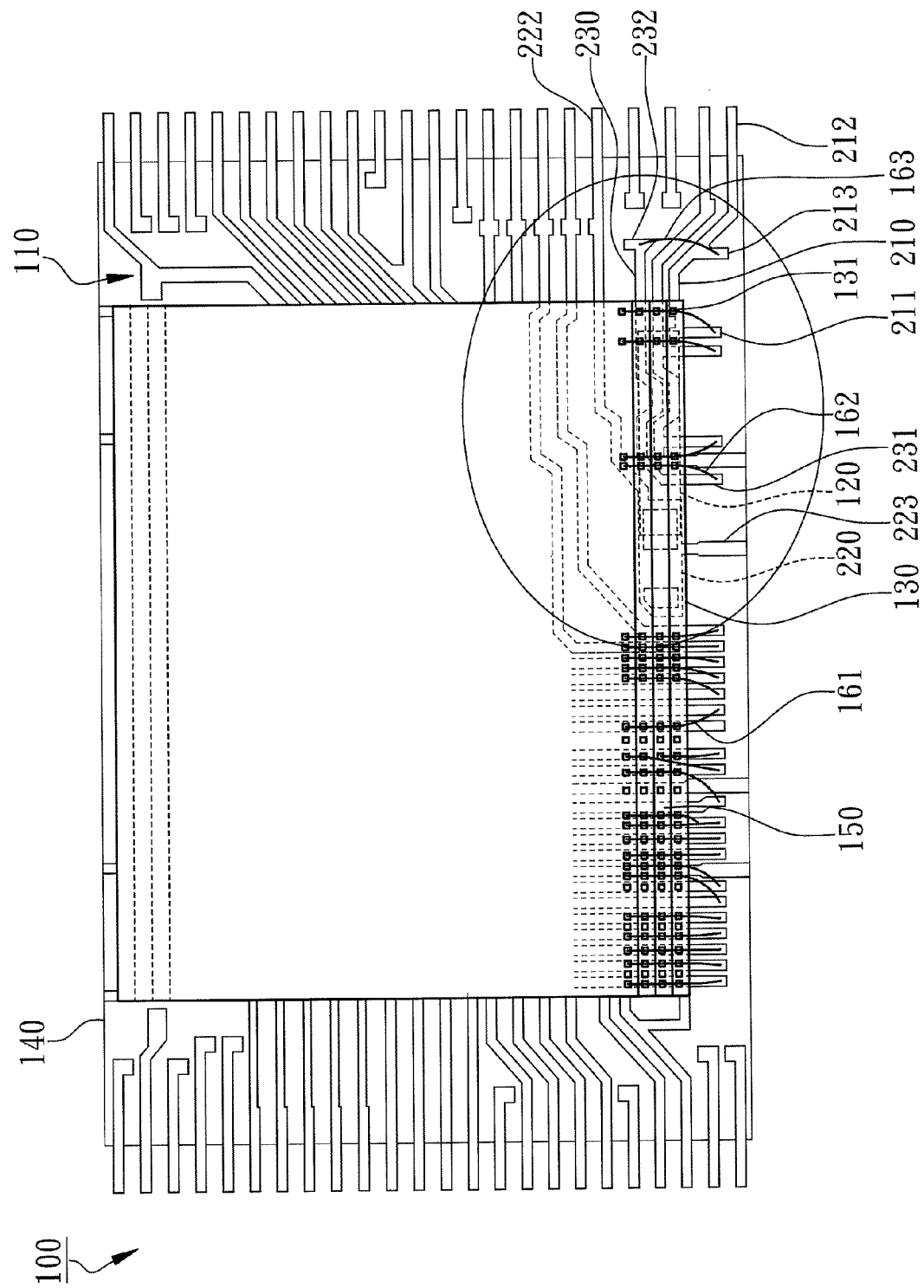
FIG. 2 is a component top view seeing through the encapsulant of the semiconductor package according to the preferred embodiment of the present invention.
Figure 3:
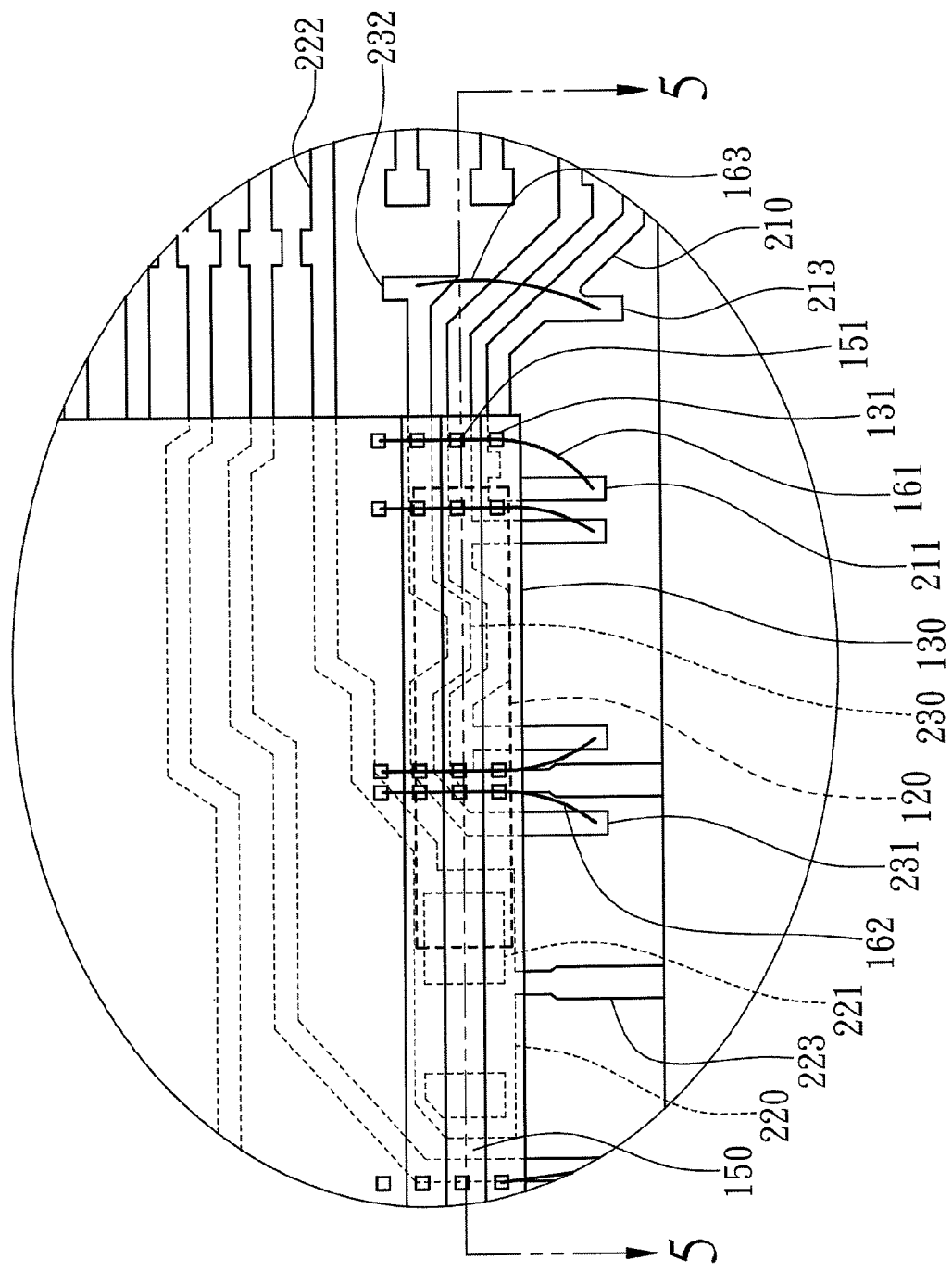
FIG. 3 is a partially enlarged top view of FIG. 2 seeing through the encapsulant of the semiconductor package according to the preferred embodiment of the present invention.
Figure 4:
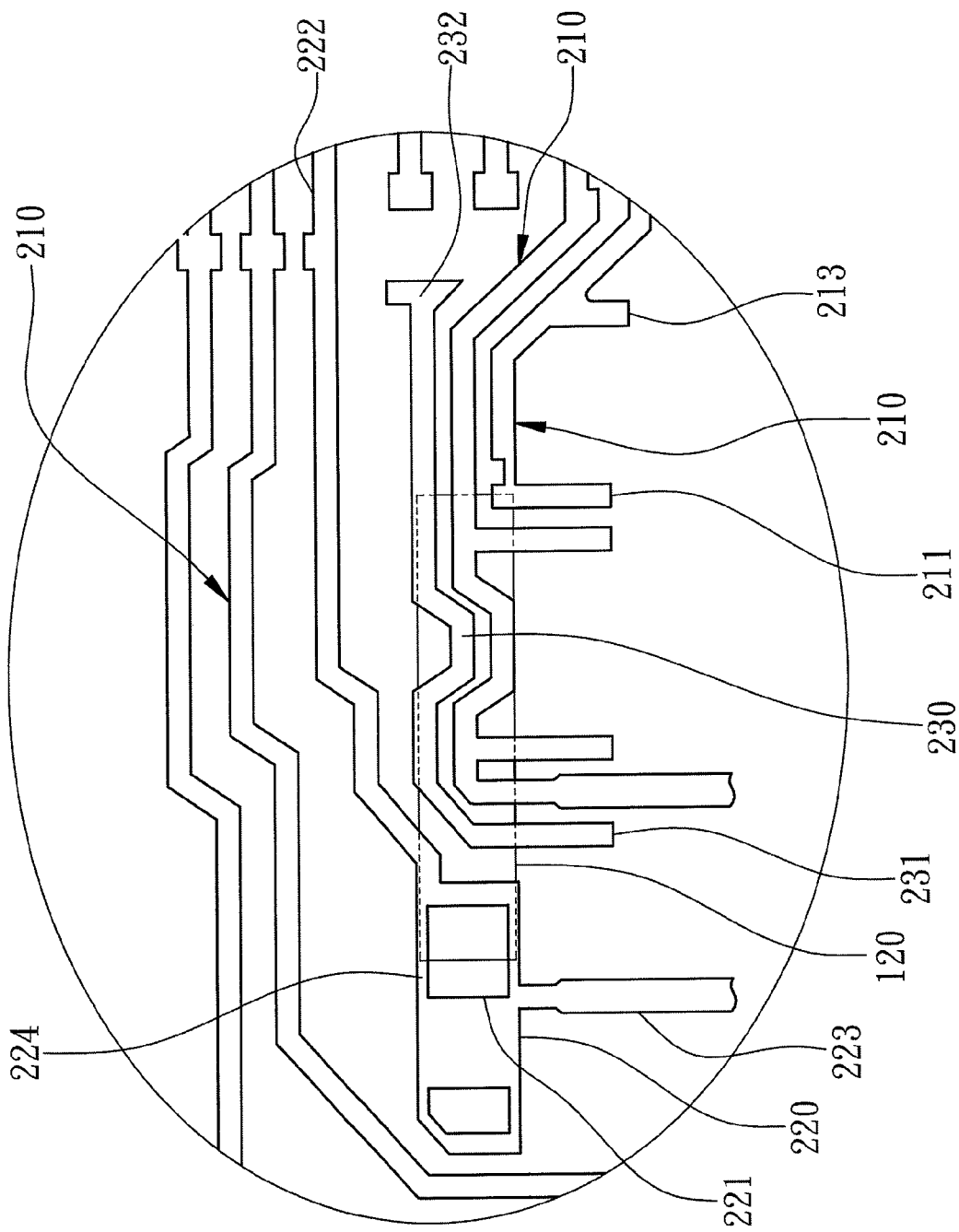
FIG. 4 is a partially enlarged top view of the leadframe utilized in the semiconductor package corresponding to FIG. 3 according to the preferred embodiment of the present invention.
Figure 5:
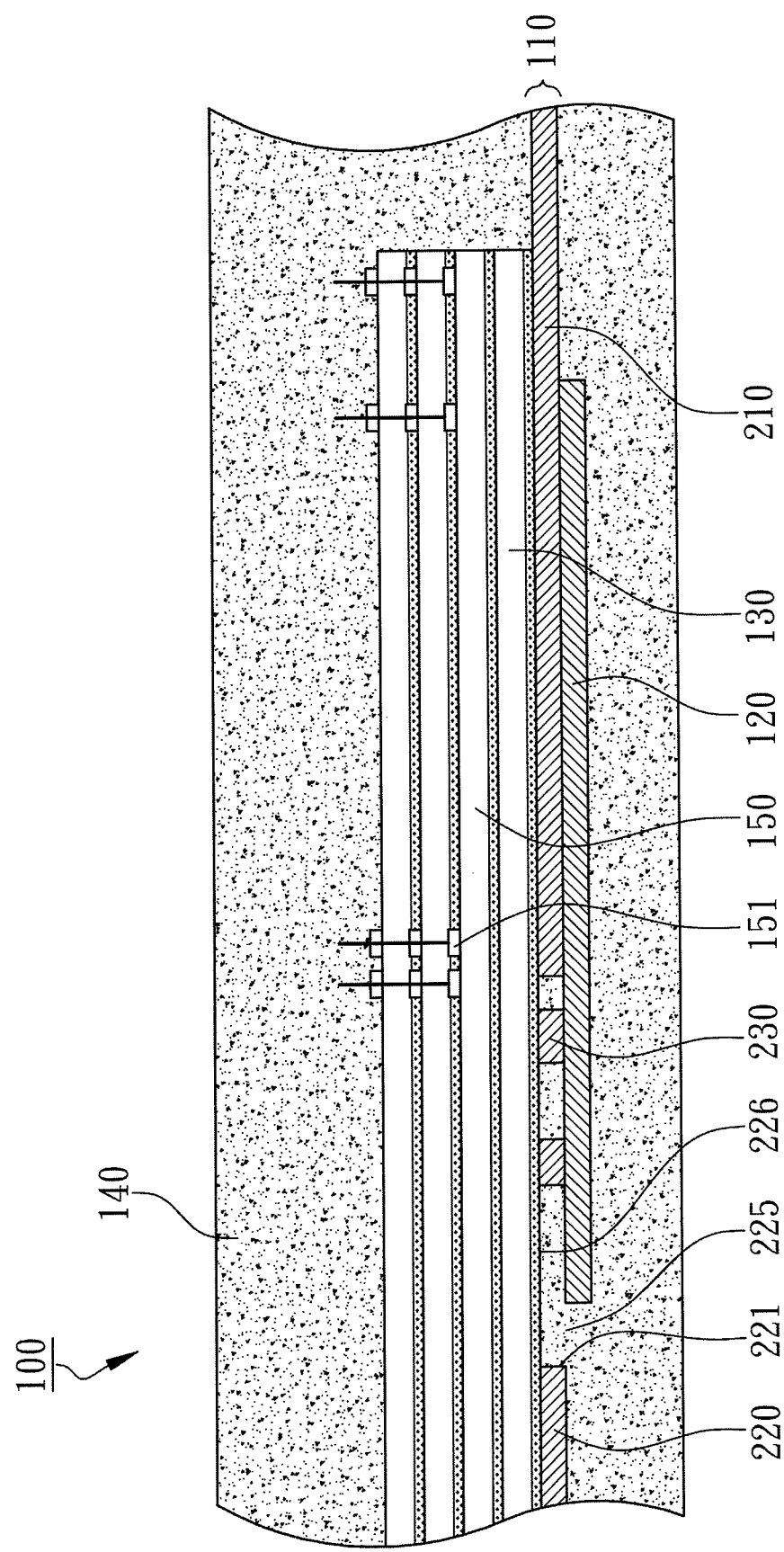
FIG. 5 is a partially enlarged cross-sectional view of the semiconductor package along a sectional line through the through hole of the die pad according to the preferred embodiment of the present invention.

According to the preferred embodiment of the present invention, a semiconductor package 100 utilizing a tape 120 to reinforce fixing of a plurality of leads 210 to a die pad 220 is illustrating in FIG. 1 for a partially component cross-sectional view, in FIG. 2 for a top view seeing through its encapsulant, and in FIG. 3 for a partially enlarged top view seeing through the encapsulant. The semiconductor package 100 primarily comprises a leadframe 110, a tape 120, a first chip 130, and an encapsulant 140. FIG. 4 is a partially enlarged top view of the leadframe 110 corresponding to FIG. 3 before semiconductor packaging assembly. One of the major features of the present invention is the combination of the leadframe 110 having the die pad 220 with a through hole 221 and the tape 120. FIG. 5 is the partially component cross-sectional view of the semiconductor package 100 cutting through the through hole 221 of the die pad 220.

The major structural frame of the leadframe 110 is made of metal such iron alloy or copper alloy where the inner leads or outer leads are plated with metal films such as tin or gold to enhance electrical connection. As shown in FIG. 4, the leadframe 110 has the plurality of leads 210 and the die pad 220 which are formed from the same frame structure and metal materials of the leadframe 110. Each lead 210 has a first inner lead 211 at the internal end within the encapsulant 140 for wire-bonding connection and a first outer lead 212 at the external end out of the encapsulant 140 where the "outer lead" is the extension of the leadframe 110 outside the encapsulant 140 which can be a gull lead, a J lead, or an I lead for external electrical connection by SMT. The die pad 220 has a through hole 221, i.e., a through hole type die pad to reinforce the die pad 220 against structural deformation with the advantage of lighter weight. Preferably, the through hole 221 is rectangle so that the die pad 220 has two side bars 224, wherein the width of the side bars 224 from the through hole 221 to the adjacent edges of the die pad 220 is approximately the same as the width of the leads 210. The die pad 220 will form a structural frame consisting of a plurality of closed type leads without inner lead(s).

The die pad 220 is a small die pad having the through hole 221, the die pad 220 can be aligned to a non wire-bonding gap between a plurality of first bonding pads 131 of the first chip 130 as shown in FIG. 2 and FIG. 3. The non wire-bonding gap is greater than the pitch of the first bonding pads 131 and is parallel to the arranging direction of the first bonding pads 131. Accordingly, the die pad 220 is arranged adjacent to the first inner leads 211 of the leads 210 as close as possible to reinforce wire bonding support to the first chip 130 and to the first inner leads 211. In the present embodiment, the die pad 220 is physically connected with a second outer lead 222 and a tie bar 223, i.e., the die pad 220 is firmly fixed during wire bonding processes, where the second outer lead 222 and the first outer leads 212 are arranged at the same side of the encapsulant 140, and the tie bar 223 extends to another side of the encapsulant 140 adjacent to the first inner leads 211. The first outer leads 210 are the signal terminals of the semiconductor package 100 and the second outer leads 222 are the NC terminals or GND terminals of the semiconductor package 100. "Tie bar" is the portion of the structural frame of the leadframe 110 connected to the die pad 220 where the exposed end of the tie bar 223 is exposed from and aligned to the leadless side of the encapsulant 140 after singulation of the leadframe 110.

The tape 120 is attached beneath the leadframe 110 adjacent to the first inner leads 211 to fix the die pad 220 and at least an adjacent one of the leads 210 in a manner that the through hole 221 covered by the tape 120 has a first opening 225 not completely covered by the tape 120 as shown in FIG. 5. Accordingly, the tape 120 does not completely cover the through hole 221 to enhance the filling of the encapsulant 140. The tape 120 is an electrical-isolated adhesive tape to fix at least an adjacent one of the leads 210 and the die pad 220 during semiconductor packaging processes and to fix the first inner leads 211 during wire bonding processes. The adjacent distance between the tape 120 and the terminals of the adjacent first inner leads 211 is preferably not greater than the distance between the first bonding pads 131 of the first chip 130 and the wire-bonding terminals of the first inner leads 211 as shown in FIG. 1 and FIG. 3. To be more specific, the tape 120 is attached to the side bars 224 of the die pad 220 to at least cover 50% of the through hole 221 to effectively adhere to the die pad 220.

The first chip 130 is a semiconductor device with internal IC circuitry such as memory, micro-processor, or logic devices formed by sawing a wafer. In the present embodiment, the first chip 130 is a NAND flash chip. The first chip 130 is attached to the leads 210 and the die pad 220 of the leadframe 110 with a DAF adhesive. The first chip 130 has the plurality of first bonding pads 131 electrically connected to the internal IC circuitry where some of the first bonding pads 131 are electrically connected to the corresponding first inner leads 211 of the leads 210 by wire-bonding. In the present embodiment, the chip dimension of the first chip 130 is close to the encapsulant 140 and greater than the dimension of the die pad 220 so that the first chip 130 can be attached to the leads 210 and the die pad 220 to cover a second opening 226 of the through hole 221 as shown in FIG. 5. The first bonding pads 131 of the first chip 130 can be electrically connected to the corresponding first inner leads 211 by a plurality of first bonding wires 161 formed by wire bonding processes to electrically connect the first chip 130 to the leadframe 110.

When the present invention involved stacking of multiple chips, the semiconductor package 100 further comprises at least a second chip 150 stacked on the first chip 130 where the second chip 150 has a plurality of second bonding pads 151 electrically connected to the first inner leads 211 where the first bonding pads 131 with at least one of the second bonding pads 151 of the second chip 150 are aligned to the adhesion area of the tape 120 to achieve wire bonding support during wire bonding processes. In the present embodiment, the first chip 130 and the second chip 150 are partially-overlapping stacked as a cascade to reduce the chip stacking height for stacking chips with the same function and the same dimension.

The encapsulant 140 encapsulates the die pad 220, the tape 120, and the first chip 130 with the leads 210 being insulatedly bonded where the encapsulant 140 completely fills into the through hole 221 through the first opening 225 without forming bubbles at the die pad 220. The encapsulant 140 is an electrically isolated molding compound formed by transfer molding which contains thermosetting resins and inorganic fillers. When the semiconductor package 100 is a multi-chip package, the encapsulant 140 further encapsulates at least one of the second chip 150. Therefore, the semiconductor package 100 utilizing tape to reinforce fixing of leads to a die pad of the present invention will be able to reinforce fixing of leads and to enhance encapsulation of the die pad with a through hole.

To be more specific, the leadframe 110 further has an isolated inner lead 230 completely encapsulated by the encapsulant 140 where two terminals of the isolated inner lead 230 are formed as a second inner lead 231 and a third inner lead 232 respectively. The second inner lead 231 is arranged and aligned with the first inner leads 211 where the tape 120 is further attached to the isolated lead 230. "Isolated inner lead" is an inner lead extended from the structural frame of the leadframe 110 located inside the encapsulating area, i.e., encapsulated inside the encapsulant 140 without exposed singulated terminals or outer leads, which serves as a bonding option done by wire bonding. The tape 120 is adhered to the isolated lead 230 during semiconductor packaging processes. Furthermore, the semiconductor package 100 further comprises a second bonding wire 162 and a third bonding wire 163 where the second bonding wire 162 electrically connects one of the first bonding pad 131 of the first chip 130 to the corresponding second inner lead 231 and the third bonding wire 163 electrically connects the third inner lead 232 to a fourth inner leads 213 of the leads 210 as shown in FIG. 3 and FIG. 4. At least one of the leads 210 can be formed between the fourth inner lead 213 and the isolated lead 230 so that the signal transmission sequence of the outer leads can be easily adjusted by the bonding option.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:
1. A semiconductor package comprising:
a leadframe having a plurality of leads and a die pad, wherein each lead has a first inner lead and the die pad has a through hole;
a tape attached beneath the leadframe adjacent to the first inner leads, the tape fixes the die pad and at least an adjacent one of the leads in a manner that the through hole covered by the tape has a first opening not completely covered by the tape;

a first chip disposed on the leads and the die pad, the first chip having a plurality of first bonding pads electrically connected to the first inner leads; and an encapsulant encapsulating the die pad, the tape, and the first chip with the leads being insulatedly bonded, wherein the encapsulant completely fills into the through hole through the first opening, wherein the die pad is aligned to a non wire-bonding gap between the first bonding pads of the first chip.

2. The semiconductor package as claimed in claim 1, wherein the first chip completely covers a second opening of the through hole.

3. The semiconductor package as claimed in claim 1, further comprising at least a second chip stacked on the first chip, the second chip having a plurality of second bonding pads electrically connected to the first inner leads, wherein the first bonding pads and the second bonding pads are located and aligned within the adhesion area of the tape.

4. The semiconductor package as claimed in claim 3, wherein the first chip and the second chip are partially-overlapping stacked as a cascade.

5. The semiconductor package as claimed in claim 1, wherein each lead has a first outer lead, wherein the die pad is physically connected with a second outer lead and a tie bar, wherein the second outer lead and the first outer leads are arranged at the same side of the encapsulant, and the tie bar extends to another side of the encapsulant adjacent to the first inner leads.

6. The semiconductor package as claimed in claim 1, wherein the leadframe further has an isolated lead completely encapsulated by the encapsulant, wherein two terminals of the isolated lead are formed as a second inner lead and a third inner lead, wherein the second inner lead is aligned with the first inner leads and the tape is further attached to the isolated lead.

7. The semiconductor package as claimed in claim 6, further comprising:

a plurality of first bonding wires electrically connecting the first bonding pads of the first chip to the corresponding first inner leads;

a second bonding wire electrically connecting one of the first bonding pads of the first chip to the second inner lead; and a third bonding wire electrically connecting the third inner lead to a fourth inner lead of the leads.

8. The semiconductor package as claimed in claim 7, wherein at least one of the leads is formed between the fourth inner lead and the isolated lead.

9. The semiconductor package as claimed in claim 1, wherein the through hole is rectangle so that the die pad has two side bars, wherein the width of the side bars from the through hole to the adjacent edges of the die pad is approximately the same as the width of the leads.

10. The semiconductor package as claimed in claim 9, wherein the tape is attached to the side bars of the die pad and at least covers 50% of the through hole.

* * * * *